United States Patent [19]
Tanaka

[11] Patent Number: 5,917,770
[45] Date of Patent: Jun. 29, 1999

[54] SEMICONDUCTOR MEMORY DEVICE FOR TEMPORARILY STORING DIGITAL IMAGE DATA

[75] Inventor: Hidehiko Tanaka, Nara, Japan

[73] Assignee: Sharp Kabushiki Kaisha, Osaka, Japan

[21] Appl. No.: 08/929,625

[22] Filed: Sep. 15, 1997

[30] Foreign Application Priority Data

Oct. 3, 1996 [JP] Japan .................................. 8-263316

[51] Int. Cl.$^6$ ...................................................... G11C 8/00
[52] U.S. Cl. ............... 365/230.03; 365/222; 365/189.01; 365/230.16
[58] Field of Search ............................... 365/230.03, 222, 365/189.01, 230.06

[56] References Cited

U.S. PATENT DOCUMENTS

| | | | |
|---|---|---|---|
| 5,463,577 | 10/1995 | Oowaki et al. ..................... | 365/230.03 |
| 5,495,444 | 2/1996 | Okubo et al. ....................... | 365/230.03 |
| 5,555,527 | 9/1996 | Kotani et al. ............................ | 365/222 |
| 5,586,078 | 12/1996 | Takase et al. ....................... | 365/230.03 |
| 5,596,541 | 1/1997 | Toda ..................................... | 365/230.03 |
| 5,638,533 | 6/1997 | Law ..................................... | 365/230.03 |
| 5,706,243 | 1/1998 | Mori .................................... | 365/230.03 |
| 5,712,827 | 1/1998 | Ogihara et al. ..................... | 365/230.03 |

FOREIGN PATENT DOCUMENTS 5-54644   3/1993   Japan .

OTHER PUBLICATIONS

English Abstract of Japanese Laid–Open Publication No. 5–54644 (Mar. 5, 1993).

*Primary Examiner*—David Nelms
*Assistant Examiner*—Tuan T. Nguyen
*Attorney, Agent, or Firm*—Morrison & Foerster, LLP

[57] ABSTRACT

A semiconductor memory device of the present invention includes a memory cell array including m sub-arrays, each having a number of memory cells arranged in a matrix and including M/m (m is an integer of 2 or more; M/m is an integer of 2 or more) memory rows and N (N is an integer of 2 or more) memory columns. In an image space in a matrix including M pixel rows and N pixel columns, the M pixel rows are divided into M/m blocks, m pixel rows in each of the M/m blocks are in a one-to-one correspondence with the m sub-arrays, and the M/m blocks are in a one-to-one correspondence with the M/m memory rows in each of the sub-arrays. The semiconductor memory device also includes a row address control circuit for, in a case where a pixel address of data on the image space is input, accessing the memory cell array by selecting a memory row corresponding to a block to which the data belongs in a sub-array corresponding to a pixel row of the block to which the data belongs.

9 Claims, 13 Drawing Sheets

PRIOR ART

PRIOR ART

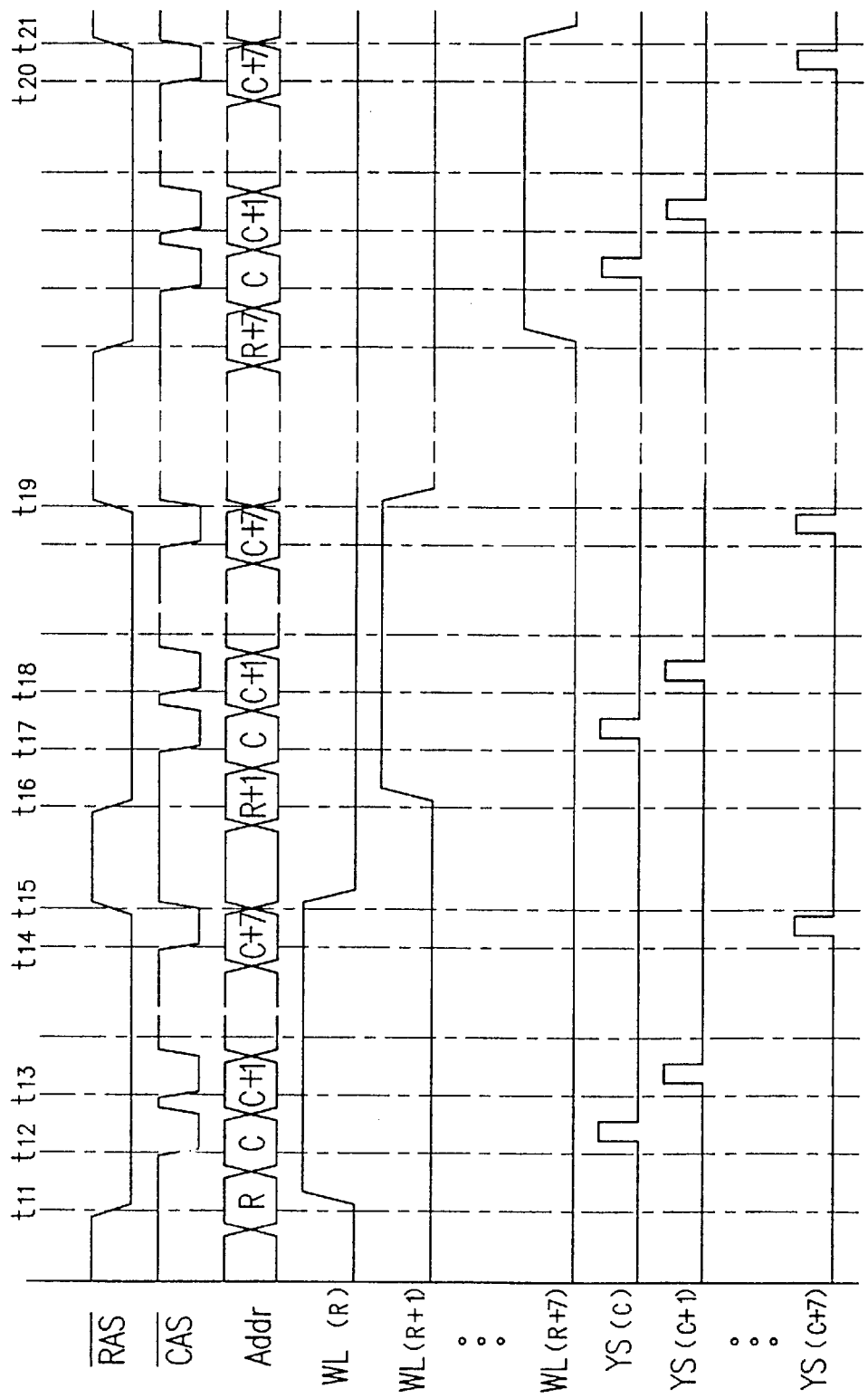
FIG. 14  *PRIOR ART*

SEMICONDUCTOR MEMORY DEVICE FOR TEMPORARILY STORING DIGITAL IMAGE DATA

BACKGROUND OF THE INVENTION

1. Field of the Invention

The present invention relates to a semiconductor memory device for temporarily storing digital image data.

2. Description of the Related Art

In recent years, there has been an increasing demand for systems capable of processing digital image data of high image quality at a high speed along with the development of multimedia computers and the digitization of TV systems. In order to process digital image data at a high speed, it is required to increase the access speed in a semiconductor memory device for temporarily storing digital image data, as well as to use a high-speed and high-performance processing apparatus.

Image data is mostly subjected to operation processing utilizing two-dimensional spatial dependence (correlation) of an image. For example, according to MPEG (Moving Picture Experts Group), image data is compressed and encoded by being subjected to DCT (Discrete Cosine Transform) processing on a rectangular region of 8×8 pixels basis. According to a multi-window system, rectangular regions of various sizes in a window displayed on a screen are required to be filled in with a background color at the time of an initial display of individual windows or clearing them. More specifically, according to these processings, image data in a rectangular region is successively and continuously accessed, so that access speed (in a row direction as well as in a column direction) of image data is required to be increased.

FIG. 12 shows a structure of a conventional DRAM (dynamic random access memory) which is mostly used as a semiconductor memory device for storing image data. The DRAM is supplied with an address Addr, a row address strobe signal RASbar, and a column address strobe signal CASbar from outside, whereby data DQ is input/output between the DRAM and the outside. The address Addr is sent to a row address latch 1 and a column address latch 2. The row address strobe signal RASbar and the column address strobe signal CASbar are sent to a clock generator 3. Based on these control signals, the clock generator 3 generates a row decode control signal RA, a column decode control signal CA, and a sense amplifier driving signal SA. The row address latch 1 receives the row decode control signal RA, latches a row address R, and sends it to a row decoder 21. The column address latch 2 receives the column decode control signal CA, latches a column address C, and sends it to a column decoder 5.

The row decoder 21 decodes the row address R, activates any word line $WL_{(R)}$ of a memory cell array 6, and selects a memory row. The memory cell array 6 is connected to a sense amplifier 6a and a column selector 6b. The sense amplifier 6a amplifies each data which is read onto bit lines from memory cells on a memory column basis. The sense amplifier 6a is driven when the sense amplifier driving signal SA becomes active. The column selector 6b selects a memory column of the memory cell array 6 in accordance with an output from the column decoder 5, and connects bit lines of the memory column to a data line DIO. The column decoder 5 decodes the column address C and sends the result of the decoding to the column selector 6b. The column selector 6b is connected to an input/output buffer 22 through one data line DIO. The input/output buffer 22 is a bidirectional three-state buffer for connecting the data line DIO to an external data bus or the like. Thus, the input/output buffer 22 allows data to be input/output between the DRAM and the outside.

The internal structure of the memory cell array 6 will be described with reference to FIG. 13. The memory cell array 6 includes a number of memory cells MC for storing data arranged in a matrix. The memory cell array 6 also includes a number of word lines WL, bit lines BL, and complementary bit lines BLbar in the row and column directions. A number of memory cells MC in the identical row (memory row) are connected to each word line WL. A number of memory cells MC in the identical column (memory column) are connected to each bit line BL and each complementary bit line BLbar. It should be noted that the memory cells MC in the identical column are alternately connected to each bit line BL and each complementary bit line BLbar. The row decoder 21 is connected to a number of word lines WL. A number of bit lines BL and complementary bit lines BLbar are connected to the sense amplifier 6a. Therefore, when any word line WL is activated by the row decoder 21, data is read from all the memory cells MC connected to the activated word line WL to each bit line BL or each complementary bit line BLbar and amplified by the sense amplifier 6a. When the column selector 6b shown in FIG. 12 connects any bit line BL or any complementary bit line BLbar to the data line DIO, the data can be read outside, or data from outside can be written in the memory cell MC through the bit line BL or the complementary bit line BLbar.

The operation in which data in a rectangular region of image data is successively and continuously accessed by using the above-mentioned conventional DRAM will be described with reference to FIG. 14. This figure shows the case where the whole data in a rectangular region of 8×8 pixels with a pixel corresponding to the row address R and the column address C being an origin (upper left corner) is written in the DRAM.

Furthermore, a page mode write cycle in which an access speed in the column direction is increased is used for this access.

The row address R is input as the address Addr from outside to the DRAM on standby, whereby the row address strobe signal RASbar falls at a time $t_{11}$. At this time, the clock generator 3 allows the row decode control signal RA and the sense amplifier driving signal SA to rise, and the row address latch 1 latches the row address R. The row decoder 21 decodes the row address R and allows the word line $WL_{(R)}$ of the memory cell array 6 to rise. Then, data from all the memory cells $MC_{(R,0)}$ through $MC_{(R,W)}$ in a selected memory row are read onto the bit lines BL or the complementary bit lines BLbar, and one row of data is amplified by the sense amplifier 6a driven by the rise of the sense amplifier driving signal SA. Next, the column address C is input as the address Addr to the DRAM, whereby the column address strobe signal CASbar falls at a time $t_{12}$. At this time, the clock generator 3 allows the column decode control signal CA to rise, and the column address latch 2 latches the column address C. The column decoder 5 decodes the column address C and allows only a decode output $YS_{(C)}$ to rise. Then, in the memory cell array 6, one bit line BL and one complementary bit line BLbar in a memory column corresponding to the column address C are connected to the data line DIO through the column selector 6b, whereby data input from outside is written in a memory cell $MC_{(R,C)}$.

Once the above-mentioned write is completed, the column address strobe signal CASbar is allowed to rise. Then, the data line DIO is pre-charged by a control signal (not shown) to go to standby. Then, a column address C+1 is input as the address Addr to the DRAM, whereby the column address strobe signal CASbar falls at time $t_{13}$. At this time, the column address latch 2 latches the column address C+1, and the column decoder 5 allows only a decode output $YS_{(C+1)}$ to rise. In the memory cell array 6, one bit line BL and one complementary bit line BLbar corresponding to the column address C+1 in the same memory row as the above are connected to the data line DIO through the column selector 6b, whereby data input from outside is written in a memory cell $MC_{(R,C+1)}$ through one bit line BL and one complementary bit line BLbar. Thereafter, the column address strobe signal CASbar is allowed to fall while the column address C is successively increased in the same way as the above. Thus, data from outside is written in memory cells $MC_{(R,C+2)}$ through $MC_{(R,C+6)}$ in a plurality of memory columns in the same memory row as the above of the memory cell array 6.

Finally, a column address C+7 is input as the address Addr to the DRAM, whereby the column address strobe signal CASbar falls at time $t_{14}$. At this time, the column decoder 5 allows only a decode output $YS_{(C+7)}$ to rise. In the memory cell array 6, data from outside is written in a memory cell $MC_{(R, C+7)}$ in a memory column corresponding to the column address C+7 in the same memory row as the above. Then, the column address strobe signal CASbar and the row address strobe signal RASbar are allowed to rise at time $t_{15}$, whereby the DRAM is returned to standby. When the row address strobe signal RASbar rises, all the bit lines BL and the complementary bit lines BLbar are pre-charged.

The row address R input as the address Addr is updated to a row address R+1, whereby the row address strobe signal RASbar falls at time $t_{16}$. At this time, the row decoder 21 decodes the row address R+1 and allows a word line $WL_{(R+1)}$ in the memory cell array 6 to rise. In the memory cell array 6, data is read onto the bit lines BL or the complementary bit lines BLbar from all the memory cells MC(R+1,0) through MC(R+1,N) in a selected memory row and amplified by the sense amplifier 6a.

Next, the column address C is input as the address Addr to the DRAM, whereby the column address strobe signal CASbar falls at time $t_{17}$. At this time, the column decoder 5 decodes the column address C and allows only the decode output $YS_{(C)}$ to rise. In the memory cell array 6, data input from outside is written in a memory cell $MC_{(R+1,C)}$.

Once the above-mentioned write is completed, the column address strobe signal CASbar is allowed to rise. Then, the row address C+1 is input as the address Addr to the DRAM, whereby the column address strobe signal CASbar falls at time $t_{18}$. At this time, the column decoder 5 allows only the decode output $YS_{(C+1)}$ to rise. In the memory cell array 6, data input from outside is written in a memory cell $MC_{(R+1,C+1)}$. Then, the column address strobe signal CASbar is allowed to fall while the column address C is successively increased in the same way as the above. Thus, data from outside is written in the remaining memory cells $MC_{(R+1,C+2)}$ through $MC_{(R+1,C+7)}$ in the same memory row as the above of the memory cell array 6. Then, the column address strobe signal CASbar and the row address strobe signal RASbar are allowed to rise at time $t_{19}$, whereby the DRAM is returned to standby.

Furthermore, when the similar operation is repeated while the row address R is successively increased, data is successively written from outside to 8 memory cells MC in each row. When data is written from outside to the last memory cell $MC_{(R+7,C+7)}$ at time $t_{20}$, the column address strobe signal CASbar and the row address strobe signal RASbar are allowed to rise at time $t_{21}$, whereby the access to the rectangular region is completed.

In the above-mentioned conventional DRAM, the column address strobe signal CA is repeatedly allowed to fall in accordance with a page mode, whereby the memory cells in the identical column can be accessed at a high speed. However, in the case where the memory cells MC in a different row are accessed, it is required to return the DRAM to standby by once allowing the address strobe signal RASbar to rise. Thus, the access speed in the row direction is lower than that in the column direction. More specifically, a period of time for the row decoder 21 to inactivate the word line WL and to disconnect the memory cells MC from the bit lines BL or the complementary bit lines BLbar, a period of time for pre-charging these bit lines BL or complementary bit lines BLbar, a period of time for inputting a new row address R and for the row decoder 21 to activate another word line WL, and a period of time for the sense amplifier 6a to amplify data read from the memory cells MC in the new memory row to each bit line BL and complementary bit line BLbar are required before the subsequent access.

Therefore, in spite of the fact that the frequency of access to image data in a relatively small rectangular region is high in encoding and decoding processing according to the MPEG, the multi-window system, and the like, the conventional DRAM for temporarily storing image data has the disadvantage of preventing a system from processing image data at a high speed due to slow access in the row direction.

SUMMARY OF THE INVENTION

A semiconductor memory device of the present invention includes: a memory cell array including m sub-arrays which operate independently of each other, each having a number of memory cells arranged in a matrix and including M/m (m is an integer of 2 or more; M/m is an integer of 2 or more) memory rows and N (N is an integer of 2 or more) memory columns, in an image space in a matrix including M pixel rows and N pixel columns, the M pixel rows being divided into M/m blocks, m pixel rows in each of the M/m blocks being in a one-to-one correspondence with the m sub-arrays, the M/m blocks being in a one-to-one correspondence with the M/m memory rows in each of the sub-arrays; and a row address control circuit for, in a case where a pixel address of data on the image space is input, accessing the memory cell array by selecting a memory row corresponding to a block to which the data belongs in a sub-array corresponding to a pixel row of the block to which the data belongs.

In one embodiment of the present invention, in a case where the pixel address of data on the image space is input and the coordinates of one apex of four apexes is input as a start address, the four apexes included in a block to which the data belongs, the row address control circuit selects a memory row corresponding to the block to which the data belongs in a sub-array corresponding to a pixel row in the block to which the data belongs, and selects a memory row corresponding to the block to which the data belongs or a memory row corresponding to a block adjacent to the block to which the data belongs in the other sub-arrays.

In another embodiment of the present invention, in each of the sub-arrays, n pieces of data (n is an integer of 2 or more and less than N) are written in parallel in n memory columns of memory cells in the memory row selected by the row address control circuit, and n pieces of data are read in parallel from the n columns of the memory cells, whereby the memory cell array is accessed.

In still another embodiment of the present invention, each of the sub-arrays includes a sense amplifier which amplifies data read onto bit lines from any one memory cell of the memory column on a memory column basis and a column selector which selects n memory columns from the entire memory columns, transfers the amplified data read onto the bit lines of the selected memory columns to data lines, and transfers the data on the data lines to bit lines of the selected memory columns.

In still another embodiment of the present invention, M, m, N, and n are assumed to be $2^M$, $2^m$, $2^N$, and $2^n$, respectively, the image space specifies a pixel row by a row address of M bits in the image address and specifies a pixel column by a column address of N bits in the image address, and in a case where the image address of the data on the image space is input, the row address control circuit selects a memory row specified by an address of M-m bits in the row address or a memory row adjacent to the memory row in each of the sub-array, and selects $2^n$ memory columns including memory columns specified by the column address of N bits, thereby accessing the memory cell array.

In still another embodiment of the present invention, in a case where the image address of the data on the image space is input, the row address control circuit selects a memory row corresponding to a block to which the data belongs in a sub-array corresponding to a pixel row of the block to which the data belongs and each pixel row after the pixel row selects a memory row corresponding to a block adjacent to the block to which the data belongs in the other sub-arrays, and selects a plurality of memory columns corresponding to a plurality of pixel columns after a pixel column to which the data belongs, thereby accessing the memory cell array.

In still another embodiment of the present invention, the image space is used for specifying a pixel row by the row address in the pixel address, and the row address control circuit includes a row sub-decoder which fully decodes an address of p bits in the row address to activate any one of $2^P$ outputs, a logic circuit which performs OR-operation with respect to adjacent outputs from the row sub-decoder to activate two outputs, and an adjacent row selecting circuit which selects any of two outputs activated by the logic circuit on a sub-array basis to select a memory row in each of the sub-arrays.

In another embodiment of the present invention, each of the sub-arrays includes a sense amplifier which amplifies data read onto bit lines from any one memory cell of the memory column on a memory column basis and a common data line which selects n memory columns from the entire memory columns, transfers the amplified data read onto the bit lines of the selected memory columns to data lines, and selects and transfers the data on the data lines corresponding to each of the sub-arrays, and an image processing system is controlled by a processor connected to the common data lines through a bus.

In another embodiment of the present invention, each of the sub-arrays includes a sense amplifier which amplifies data read onto bit lines from any one memory cell of the memory column on a memory column basis and a wide common data line which selects n memory columns from the entire memory columns, transfers the amplified data read onto the bit lines of the selected memory columns to data lines, and is connected in parallel to the data lines corresponding to each of the sub-arrays, and an image processing system is controlled by a processor connected to the common data lines through a bus.

Hereinafter, the function of the present invention will be described.

According to the present invention, a memory cell array is divided into a plurality of sub-arrays, and data in a relatively small rectangular region arbitrarily set on an image space can be prevented from being placed in different memory rows in the identical sub-array. Therefore, a plurality of sub-arrays are simultaneously accessed or different sub-arrays are successively and continuously accessed, whereby data in the rectangular region can be accessed at a high speed even in the row direction.

According to the present invention, merely by specifying any pixel address, a plurality of rows of data in the rectangular region with the origin being the pixel address can be simultaneously accessed or successively accessed with time division. A row partition of the rectangular region does not always correspond to a block partition of an image space. A row to be selected in each sub-array can be adjusted.

According to the present invention, merely by specifying any pixel address, a plurality of columns of data in the rectangular region with the origin being the pixel address can be simultaneously accessed. In the case where a plurality of rows of data can be simultaneously accessed, all of the data in the rectangular region can be simultaneously accessed.

According to the present invention, n columns of data can be simultaneously accessed with n data lines.

According to the present invention, n columns of data can be successively accessed with time division with one data line.

According to the present invention, data of m rows×n columns can be simultaneously accessed with m×n common data lines.

According to the present invention, data of m rows×n columns can be successively accessed by m rows with time division with m common data lines.

According to the present invention, data of m rows×n columns are stored in registers, and the stored data can be subjected to any image processing from outside.

According to the present invention, m rows of data are stored in each register and subjected to any image processing from outside.

According to the present invention, any image processing can be performed at a high speed with respect to data of m rows×n columns in a rectangular region in a semiconductor memory device.

According to the present invention, any image processing can be performed at a high speed with respect to data of m rows in a rectangular region in a semiconductor memory device.

According to the present invention, a row address control circuit can easily select a memory row in each sub-array, using M-m bits in a row address.

According to the present invention, even in the case where a rectangular region extends across two blocks, a memory row in each sub-array can be selected in accordance with the respective blocks, and a rectangular region at any position can be accessed.

According to the present invention, a column address is decoded, whereby a memory column in each sub-array can be easily selected.

According to the present invention, different memory rows adjacent to each other can easily be selected on a sub-array basis by using a row sub-decoder capable of selecting two memory rows.

According to the present invention, different memory rows adjacent to each other can easily be selected on a sub-array basis by using an adjacent row selecting circuit which selects any of two memory rows using a part of bits of a row address.

Thus, the invention described herein makes possible the advantage of providing a semiconductor memory device which is capable of increasing the speed of access to data in a rectangular region by dividing a memory cell array into a plurality of sub-arrays while preventing data in a rectangular region from being placed in different rows in the same sub-array.

This and other advantages of the present invention will become apparent to those skilled in the art upon reading and understanding the following detailed description with reference to the accompanying figures.

BRIEF DESCRIPTION OF THE DRAWINGS

FIG. 14 is a timing diagram showing an operation in a page mode of the conventional DRAM.

DESCRIPTION OF THE PREFERRED EMBODIMENTS

The present invention will be described by way of illustrative examples with reference to the drawings.

Example 1

Figure 12:
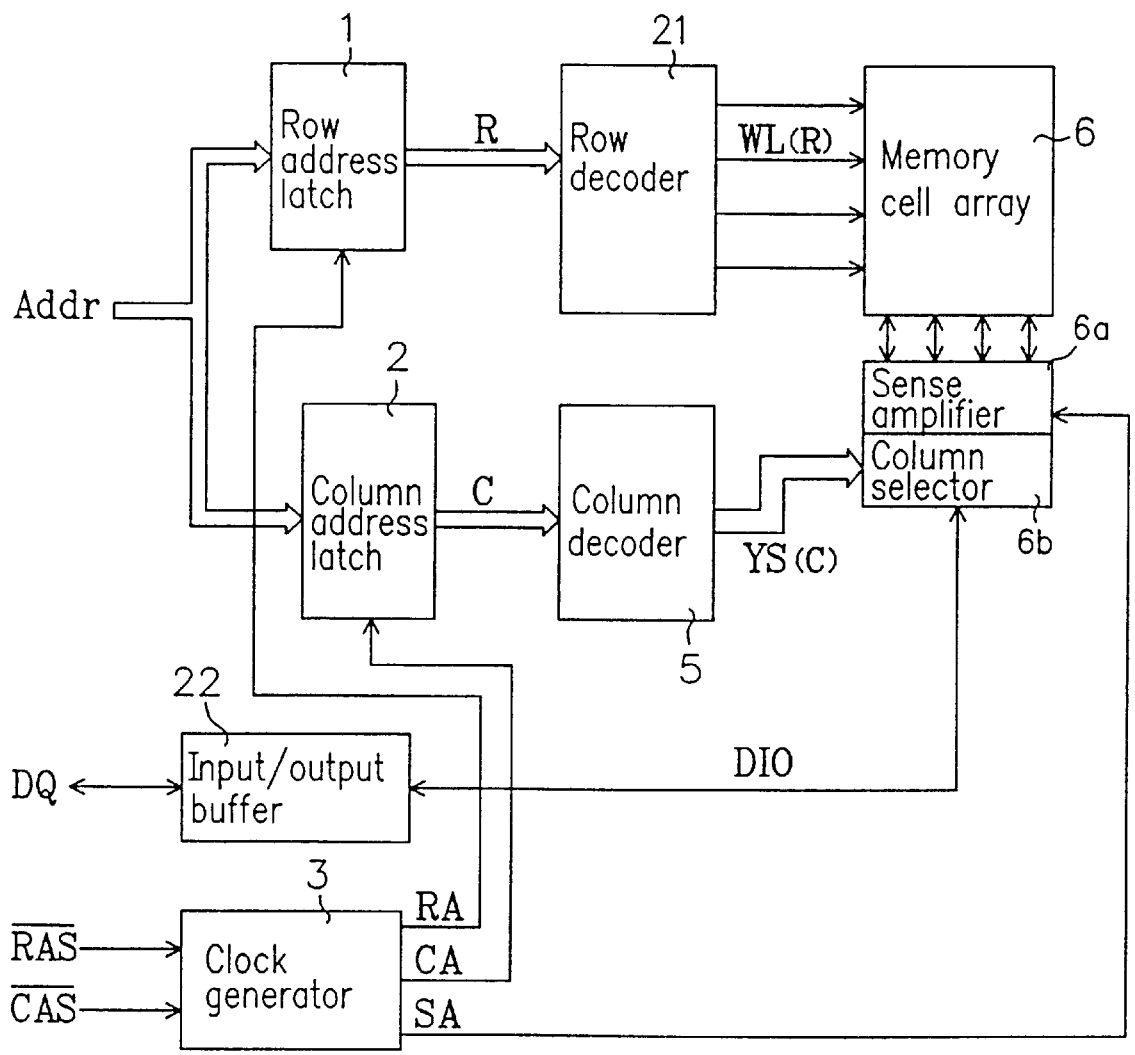
FIG. 12 is a block diagram showing an entire structure of a conventional DRAM.
Figure 13:
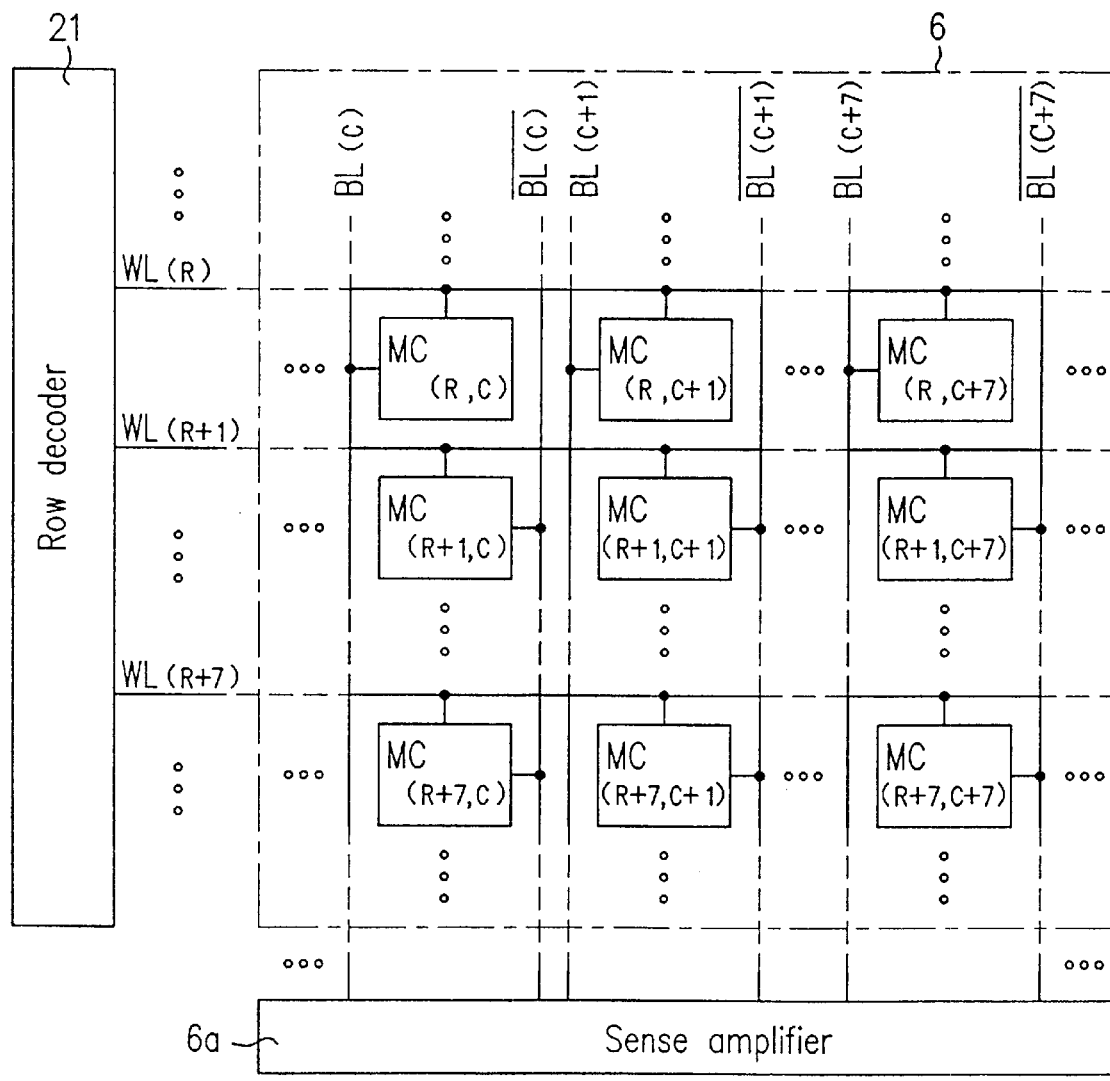
FIG. 13 is a block diagram showing a structure of a conventional memory cell array.

FIGS. 1 through 10 are diagrams illustrating a semiconductor memory device according to the present invention. In these figures, components which have the same functions as those in the conventional example shown in FIGS. 12 through 14 are denoted with the same reference numerals as those therein. In Example 1, a semiconductor memory device for temporarily storing data to be displayed on a display of 640×480 pixels (VGA (Video Graphics Array) standard, etc.) will be described. The present invention is not limited to data to be displayed on an actual display, and can be used for storing data in a virtual image space assumed by applications and the like. Thus, any pixel structure can be used. Usual image data is composed of a plurality of bits for the purpose of specifying a color and a grayscale on one pixel basis. However, in the present example, for simplicity, it is assumed that one pixel is composed of one bit of data. Furthermore, in this Example, a DRAM is used as the semiconductor memory device. It should be noted that the present invention is applicable to all suitable semiconductor memory devices which can be randomly accessed, such as an SRAM (Static Random Access Memory), as well as a DRAM.

Figure 1:
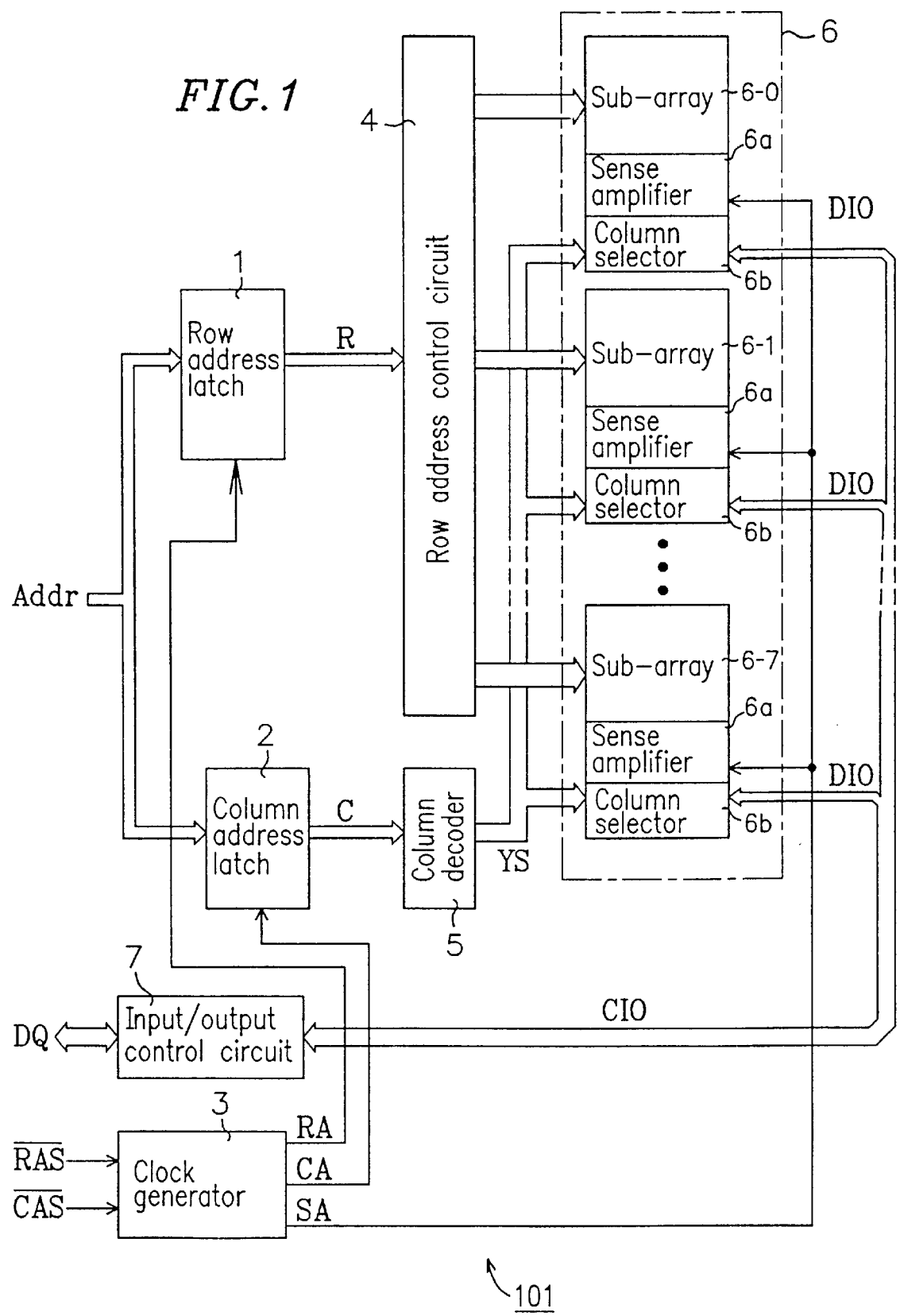
FIG. 1 is a block diagram showing an entire structure of a semiconductor memory device in Example 1 according to the present invention.

FIG. 1 shows an entire structure of a semiconductor memory device 101. The semiconductor memory device 101 has a structure in which an address Addr is input from an external processor or the like through an address bus or the like, a row address strobe signal RASbar and a column address strobe signal CASbar are input through a control bus or the like, and data DQ is input/output through a data bus or the like.

The address Addr is sent to a row address latch 1 and a column address latch 2. The row address strobe signal RASbar and the column address strobe signal CASbar are sent to a clock generator 3. Based on these control signals, the clock generator 3 generates internal control signals for controlling timing of an access operation, i.e., a row decode control signal RA, a column decode control signal CA, and a sense amplifier driving signal SA. The row decode control signal RA informs a row address latch 1 of timing at which a row address R is input as the address Addr. In response to the row decode control signal RA, the row address latch 1 latches the row address R and sends it to a row address control circuit 4. The column decode control signal CA informs a column address latch 2 of timing at which a column address C is input as the address Addr. In response to the column decode control signal CA, the column address latch 2 latches the column address C and sends it to a column decoder 5.

It is assumed that the row address R is a pixel address for specifying any pixel row of 480 rows in a display of 640×480 pixels and composed of an address signal of 10 bits. It is assumed that the column address C is a pixel address for specifying any pixel column of 640 columns in a display of 640×480 pixels and composed of an address signal of 10 bits. In the case of using the row address R of 10 bits and the column address C of 10 bits, the largest image space can be composed of 1024 ($=2^{10}$) rows of pixels and 1024 columns of pixels. However, herein, only a partial region is used. In a general DRAM, a pixel address is input as separate row address R and column address C. However, the row address R and the column address C may be input together.

The row address control circuit 4 selects a memory row of a memory cell array 6 in accordance with the row address R. The memory cell array 6 in the present example is divided into 8 ($=2^3$) sub-arrays 6-0 to 6-7 in the row direction. Each sub-array 6-i (i is an integer in the range of $0 \leq i \leq 7$) includes memory cells arranged in a matrix composed of 128 memory rows and 1024 memory columns. The sub-arrays operate independently of each other and can be accessed simultaneously. Thus, the entire memory cell array 6 includes 1024 (128 rows×8) memory rows and 1024 memory columns and corresponds to the largest image space composed of 1024 pixel rows and 1024 pixel columns. The display in the present example uses only a part of the largest image space. Therefore, in each sub-array 6-i, it is not required to actually arrange memory cells in 128 rows and 1024 columns. The memory cells should be arranged only in a region corresponding to 640×480 pixels of the display.

Figure 2:
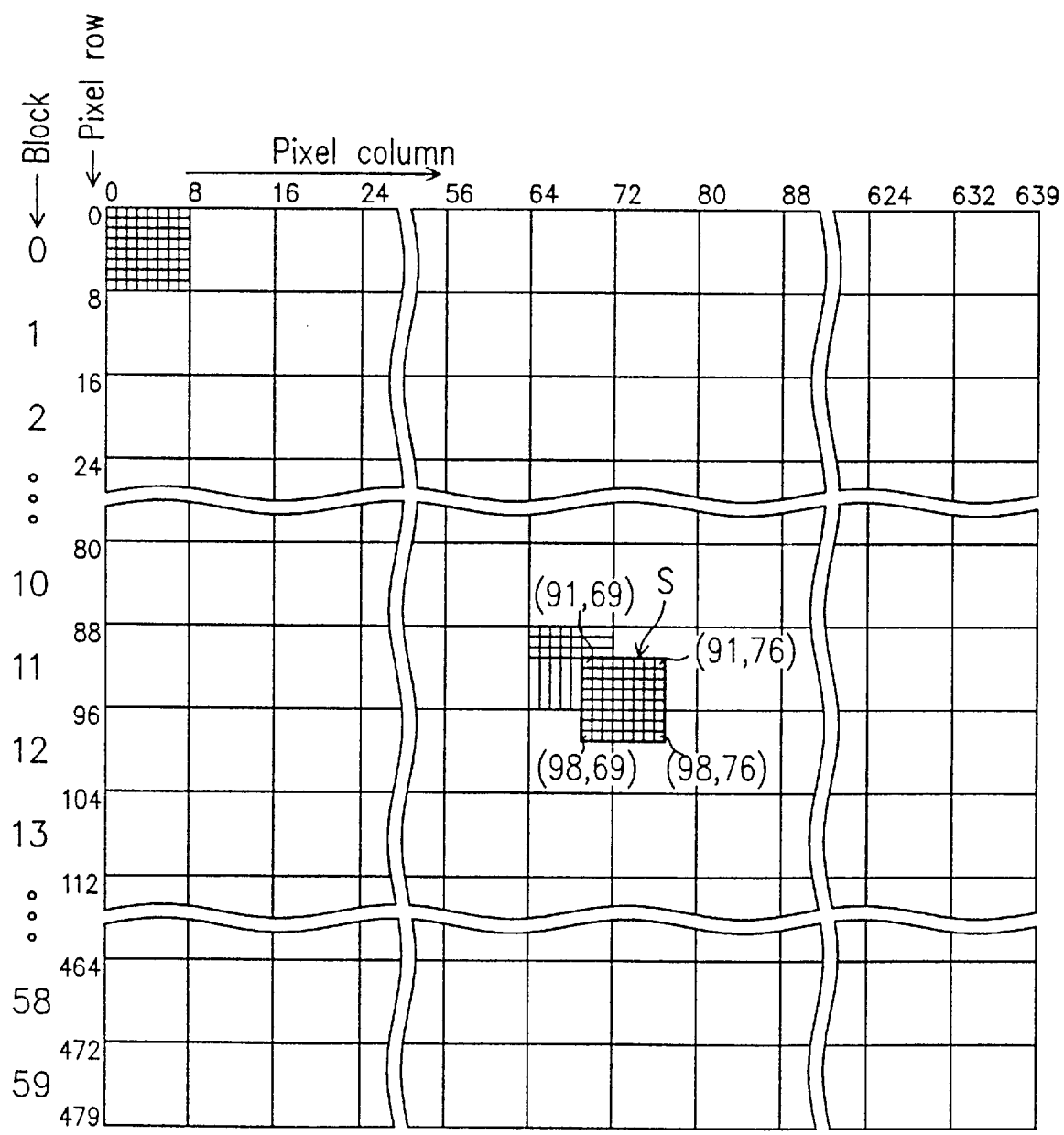
FIG. 2 shows an entire region of 640×480 pixels on a display in Example 1 according to the present invention.

The relationship between the pixel address in the display of 640×480 pixels and the memory row and column of each sub-array 6-i will be described. As shown in FIG. 2, the coordinate of each pixel on the display of 640×480 pixels can be represented by 0 to 479 pixel rows and 0 to 639 pixel columns, with the upper left corner being disposed at the 0th row and the 0th column. For example, the pixel at the upper left corner of a rectangular region S of 8×8 pixels shown in FIG. 2 belongs to the 91st pixel row and the 69th pixel column, so that it can be represented by a coordinate (91, 69). In FIG. 2, it is assumed that the smallest region in the form of a square surrounded by lines corresponds to each pixel.

In the semiconductor memory device of the present example, the row address R of 10 bits and the column address C of 10 bits are input as the addresses Addr when data on each pixel is written and read. The column address C of 10 bits specifies which pixel column a pixel belongs to. Herein, it is assumed that a decimal number of 0 to 1024 (actually, up to 639) represented by the column address C represents the column number. It is also assumed that the column address C represents a memory column number counted from the 0th column in each sub-array 6-i.

Figure 3:
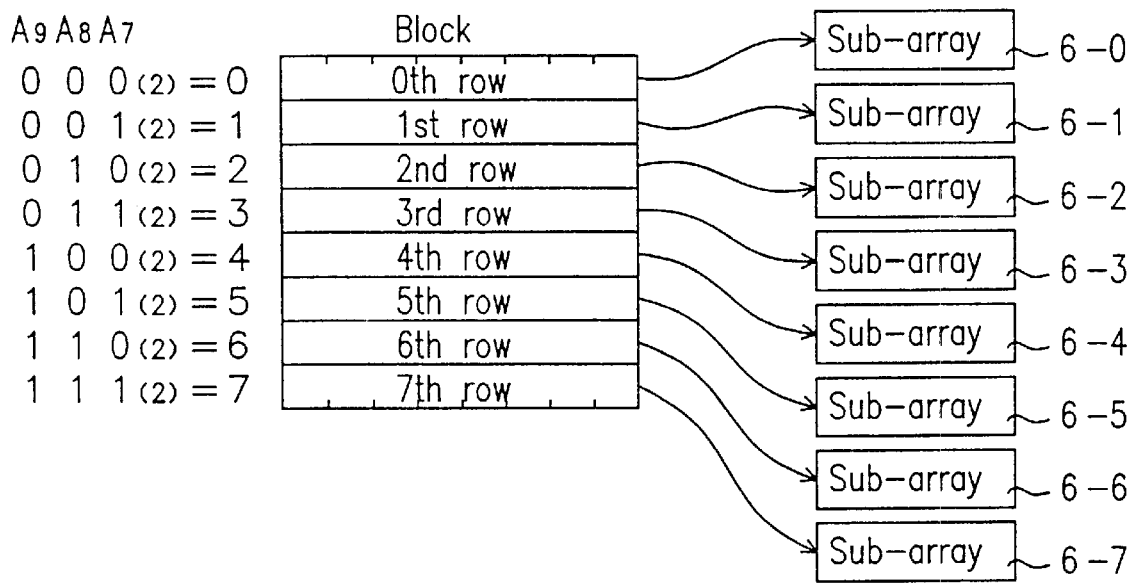
FIG. 3 shows the relationship between each block on the display and each sub-array in Example 1 according to the present invention.

The row address R of 10 bits specifies which pixel row a pixel belongs to. However, the row address R does not directly represent the pixel row number. The pixel row number is specified by dividing the row address R of 10 bits including $A_9$–$A_0$ into $A_9$–$A_7$ of the upper 3 bits and $A_6$–$A_0$ of the lower 7 bits. More specifically, the display region of 640×480 pixels shown in FIG. 2 is considered as being divided into each rectangular region of 8×8 pixels. Only the division in the row direction is related to the row address R. Therefore, 480 pixel rows are divided into 60 (=480/8) blocks each including 8 rows. The 0th block includes the 0th row to the 7th row, the 1st block includes the 8th row to the 15th row, etc., and the 59th block includes the 472nd row to the 479th row. The row address R represents the block number by a decimal number of 0 to 127 of $A_6$–$A_0$ of the lowest 7 bits. As shown in FIG. 3 (showing a rectangular region of 8×8 pixels), in each block, a decimal number of 0 to 7 of $A_9$–$A_7$ of the upper 3 bits represents the pixel row counted from the 0th row in the block. For example, the pixel at a coordinate (91, 69) on the upper left corner of the rectangular region S of 8×8 pixels belongs to the 3rd pixel row (i.e., corresponding to the 91st (=88+3) pixel row in the entire display) counted from the 0th pixel row in the 11th block (the 88th row to the 95th row). Therefore, $A_6$–$A_0$ of the lower 7 bits become "0001011(2)" ((2) represents a binary notation; 0001011(2) is 11 in a decimal notation), and $A_9$–$A_7$ of the upper 3 bits become "011(2)" (011(2) is 3 in a decimal notation). The row address R of the data becomes "0110001011(2)" (the decimal notation thereof has no meaning here). The row address R and the column address C are not limited to the above-mentioned bit configuration they may have any configuration. Furthermore, a pixel address in another configuration may be input and internally transformed into such row address R, column address C, and the like. For example, in the case where pixel addresses, which are continually and one-dimensionally arranged, are input, an origin address (i.e., a pixel address at the 0th row and the 0th column) in the image space is subtracted from the input pixel addresses, and the result is divided by the total number of pixel columns. The quotient represents the pixel column number, and the remainder represents the pixel row number. Thus, based on the quotient and the remainder, the input pixel addresses can be transformed into the row address R, the column address C, and the like.

Figure 4:
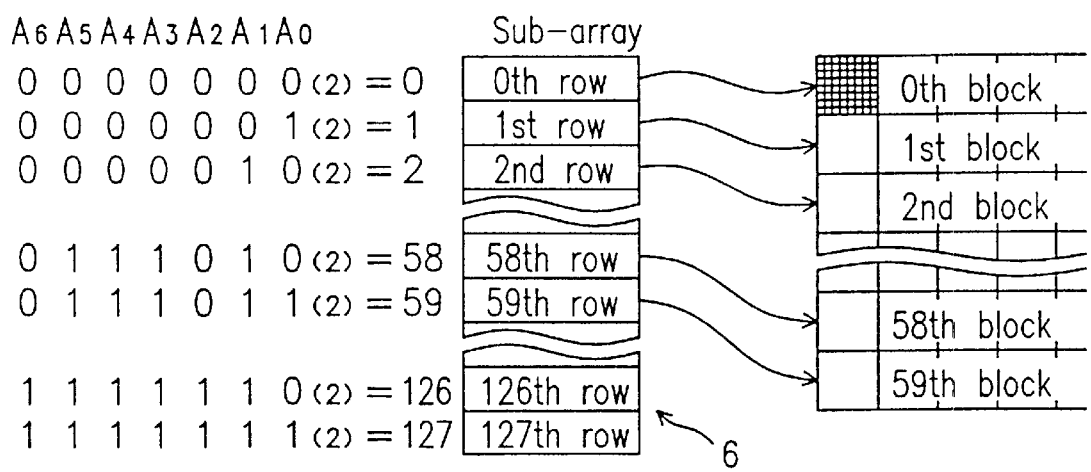
FIG. 4 shows the relationship between each block on the display and each sub-array in Example 1 according to the present invention.

The respective pixel rows in the block correspond to different sub-arrays 6-i. More specifically, data on a pixel belonging to the 0th pixel row in each block is stored in the first sub-array 6-0; data on a pixel belonging to the 1st pixel row is stored in the subsequent sub-array 6-1; data on a pixel belonging to the 2nd pixel row is stored in the subsequent sub-array 6-2, etc.; and data on a pixel belonging to the 7th pixel row is stored in the last sub-array 6-7. Thus, the row address R input to the semiconductor memory device specifies the sub-array 6-i with $A_9$–$A_7$ of the upper 3 bits. The row address R specifies a memory row in the sub-array 6-i with $A_6$–$A_0$ of the lower 7 bits, as shown in FIG. 4. One hundred twenty-eight memory rows (actually, only 60 memory rows are used) in each sub-array 6-i respectively correspond to 60 blocks. Thus, data stored in different memory rows in the identical sub-array 6-i become data on pixel rows which are away from each other by at least one block on the display. Data on pixel rows which are away from each other by less than 8 rows on the display is necessarily stored in different sub-arrays 6-i.

Each sub-array 6-i is connected to a sense amplifier 6a and a column selector 6b. The sense amplifier 6a amplifies data read onto bit lines from memory cells in any memory row on a memory column basis. The sense amplifier 6a is driven when the sense amplifier driving signal SA becomes active, so as to perform the amplifying operation. Thus, in each sub-array 6-i, when one memory row is selected by the row address control circuit 4, data is read onto bit lines from memory cells in all the memory columns in the selected memory row and amplified. This enables a plurality of memory columns in the identical memory row to be simultaneously accessed. In a DRAM, data is once read from memory cells in all the memory columns in the identical memory row and rewritten in the case of write access as well as read access (data other than that newly written is refreshed). Therefore, the operation of the sense amplifier 6a is required. Furthermore, before the sense amplifier 6a operates, bit lines are pre-charged so as to make the electric potential of the bit lines constant. In each sub-array 6-i, a plurality of memory columns can be accessed simultaneously in this way; however, a plurality of memory rows cannot be selected simultaneously. More specifically, the sub-array 6-i refers to the collection of the largest number of memory cells in which a plurality of memory rows cannot be selected simultaneously. Thus, in the case where data in different memory rows in the identical sub-array 6-i is continuously accessed, bit lines are once pre-charged after the completion of access to the previous data; a new memory row is selected; the amplifying operation by the sense amplifier 6a is completed; and new data is accessed. According to the present invention, the memory cell array is divided into a plurality of sub-arrays 6-i, and data in a rectangular region with a predetermined size arbitrarily set on the image space is prevented from being placed in different memory rows in the identical sub-array 6-i, whereby data in the rectangular region can be made accessed at a higher speed.

The column selector 6b selects a memory column in the sub-array 6-i in accordance with an output from the column decoder 5 and connects the bit lines in the memory column to data lines DIO. The column decoder 5 decodes the column address C, and sends the decoding result to a column selector 6b of each sub-array 6-i. Thus, regarding all the sub-arrays 6-i, the identical memory column is selected by each column selector 6b. The row address control circuit 4 selects a memory row in each sub-array 6-i in accordance with the row address R. Thus, in the semiconductor memory device of the present example, 8 sub-arrays 6-i can be accessed simultaneously by inputting one pixel address. The row address control circuit 4 does not always select the identical memory row regarding all the sub-arrays 6-i. As described later in detail, adjacent memory columns are selected regarding a part of the sub-arrays 6-i.

In the present example, 8 data lines DIO are connected to each sub-array 6-i. The column selector 6b simultaneously selects 8 continuous memory columns counted from the memory column corresponding to the column address C and connects 8 bit lines of these memory columns to the data lines DIO, whereby data of 8 bits is simultaneously transferred. The number of the data lines DIO and the number of columns which are simultaneously selected by the column selector 6b are not limited thereto. For example, one data line DIO is connected to each sub-array 6-i, and each column selector 6b selects only one memory column, whereby data of 1 bit is transferred. Alternatively, one data line DIO is connected to each sub-array 6-i, and each column selector 6b successively connects each bit line of a plurality of memory columns to one data line DIO with a time delay, whereby data of a plurality of bits can be successively transferred with time division. In this case, each column selector 6b may automatically select a plurality of memory columns or may select any plurality of memory columns successively in response to a control signal from outside as in a page mode or the like shown in the conventional example.

The data lines DIO which are connected by 8 bits to each sub-array 6-i in the present example are connected to an input/output control circuit 7 as 64 common data lines CIO. The input/output control circuit 7 is an input/output buffer for connecting the common data lines CIO to external data buses or the like and allows data DQ of 64 bits to be input/output in parallel. Thus, at write access, the data DQ of 64 bits is input to the common data lines CIO through the input/output control circuit 7, and simultaneously sent by 8 bits to 8 sub-arrays 6-i through 8 data lines DIO. At read access, data read by 8 bits from 8 sub-arrays 6-i is sent to the input/output control circuit 7 through the data lines DIO and the common data lines CIO and simultaneously output as the data DQ of 64 bits. For example, the input/output control circuit 7 may divide the data of 64 bits on the common data lines CIO on a 8-bit basis in the row or column direction and allow the data to be successively input to or output from outside as the data DQ of 8 bits. In the case where one data line DIO is connected to each sub-array 6-i, and there are 8 common data lines CIO, the data on the common data lines CIO is input to or output from outside by 8 bits as the data DQ or input to or output from outside as the data DQ of 64 bits in the column direction. In this way, the data can be input/output by any method using an arbitrary number of bits. Furthermore, the data can be input to or output from the common data lines CIO by selecting the data lines DIO of the respective sub-arrays 6-i. Alternatively, the data can be input to or output from the common data lines CIO by selecting a data line DIO of one sub-array 6-i.

Figure 5:
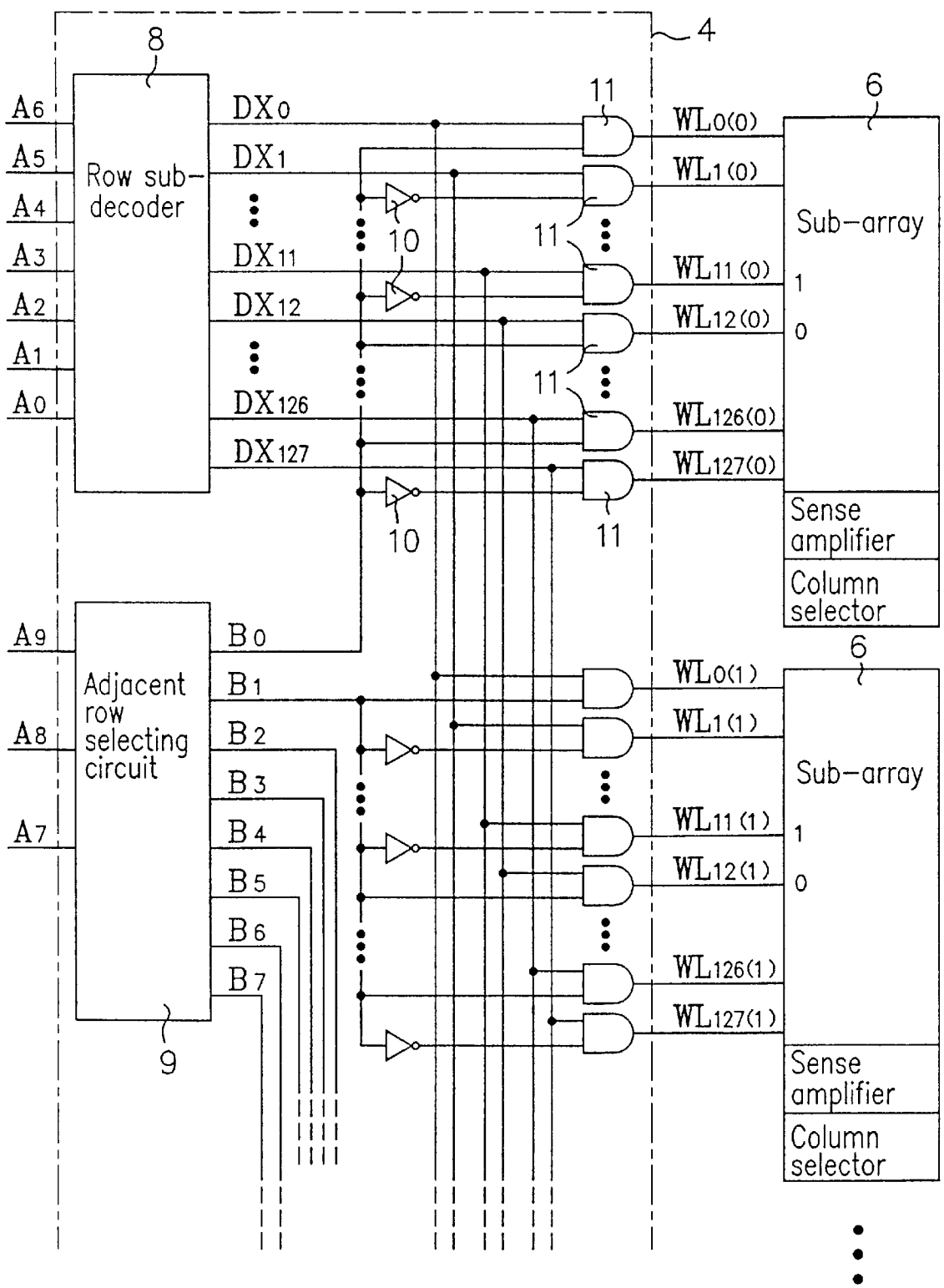
FIG. 5 is a block diagram showing a part of a structure of a row address control circuit in Example 1 according to the present invention.
Figure 6:
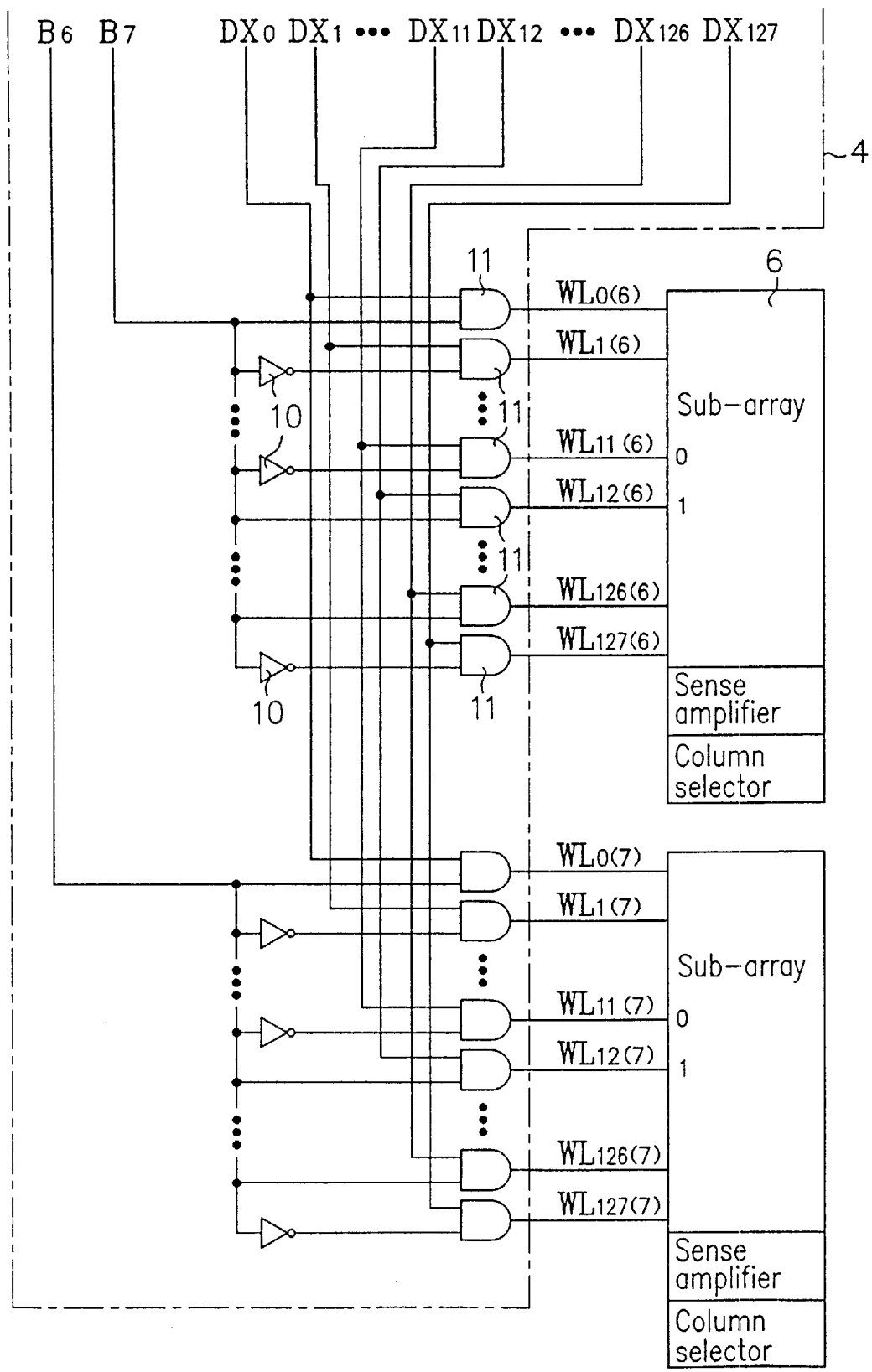
FIG. 6 is a block diagram showing another part of the structure of the row address control circuit in Example 1 according to the present invention.
Figure 7:
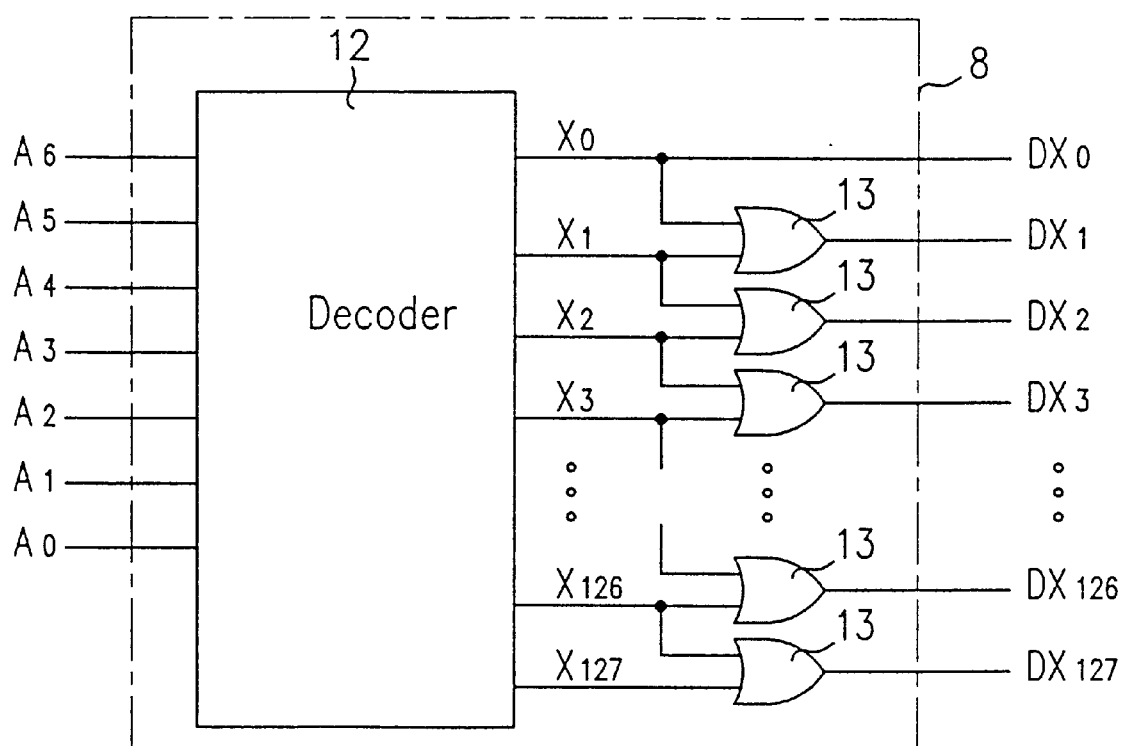
FIG. 7 is a block diagram showing a structure of a row sub-decoder in Example 1 according to the present invention.

As shown in FIGS. 5 and 6, the row address control circuit 4 is composed of a row sub-decoder 8, an adjacent row selecting circuit 9, a plurality of inverters 10, and a plurality of AND gates 11. The row sub-decoder 8 receives $A_6$–$A_0$ of the lower 7 bits of the row address R and outputs row sub-decode signals $DX_1$–$DX_{127}$ through 128 output lines. More specifically, as shown in FIG. 7, the row sub-decoder 8 includes a decoder 12 and a plurality of OR gates 13. The decoder 12 fully decodes $A_6$–$A_0$ of the lower 7 bits and outputs decode signals $X_0$–$X_{127}$ any one of which becomes active through 128 output lines. The decode signals $X_1$–$X_{127}$ other than the decode signal $X_0$ are subjected to OR operation by each OR gate 13 with respect to the decode signals $X_0$–$X_{126}$ on the output lines adjacent forward and transformed into row sub-decode signals $DX_1$–$DX_{127}$. The decode signal $X_0$ becomes a row sub-decode signal $DX_0$ as it is. Thus, the row sub-decoder 8 simultaneously activates the row sub-decode signal $DX_j$ (j is an integer in the range of $0 \leq j \leq 126$) which becomes active in the case where $A_6$–$A_0$ of the lower 7 bits of the row address R are fully decoded and a row sub-decode signal $DX_{j+1}$ on the output lines adjacent backward. The row sub-decoder 8 shown in FIG. 7 may singly activate the last sub-decode signal $DX_{127}$ since there is no block after the last block. It is assumed that all 128 memory rows are effective in each sub-array 6-i shown in FIGS. 5 and 6. Therefore, the row sub-decoder 8 outputs up to the last row sub-decode signal $DX_{127}$. However, in the case where only up to 60 memory rows are effective, the row sub-decoder 8 should output up to the row sub-decode signal $DX_{59}$.

Figure 8:
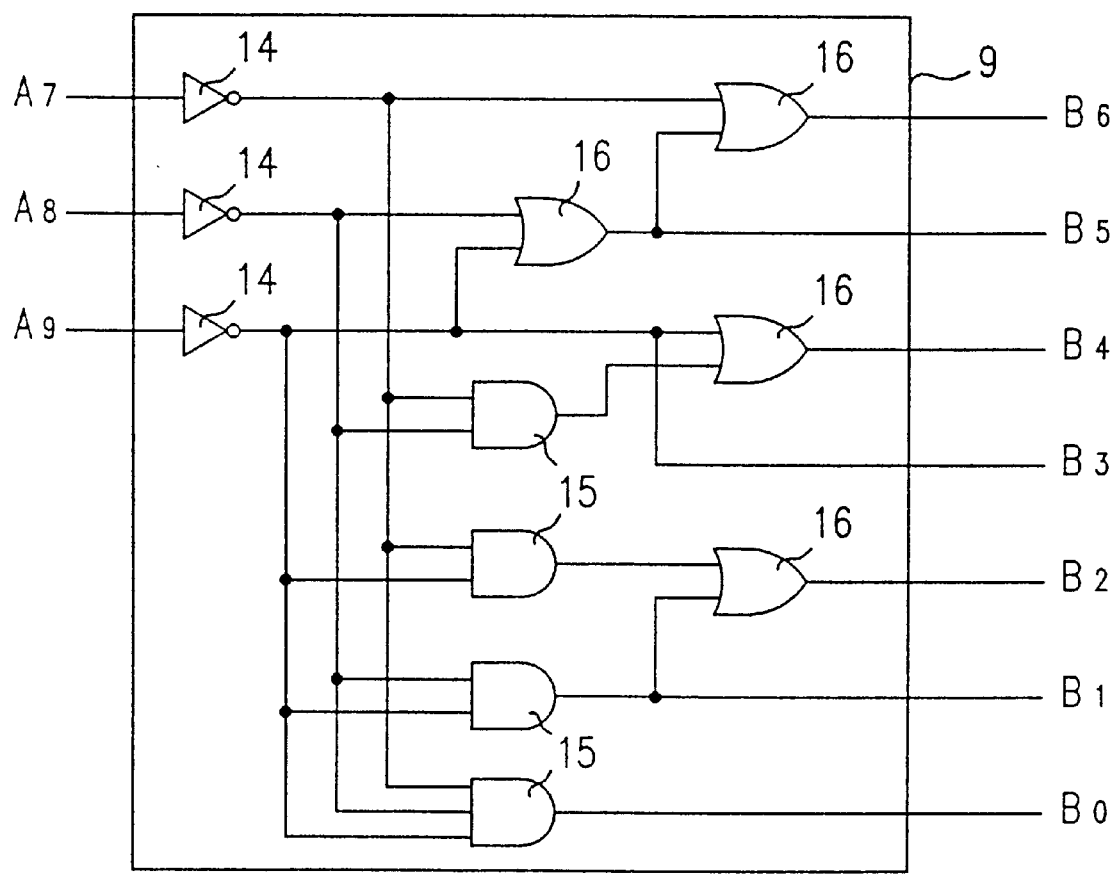
FIG. 8 is a block diagram showing a structure of an adjacent row selecting circuit in Example 1 according to the present invention.

As shown in FIGS. 5 and 6, the row sub-decode signals $DX_0$–$DX_{127}$ output from the row sub-decoder 8 are sent to word lines $WL_0$–$WL_{127}$ of each sub-array 6-i through each AND gate 11. Any one of the word lines $WL_0$–$WL_{127}$ of each sub-array 6-i is activated, whereby the corresponding memory row is selected. A selection signal $B_i$ output from the adjacent row selecting circuit 9 is input as it is to the other input of each AND gate 11 connected to the word lines $WL_0 \ldots WL_{12} \ldots WL_{126}$ corresponding to the even number row in each sub-array 6-i. The selection signal $B_i$ output from the adjacent row selecting circuit 9 is also input through an inverter 10 to the other input of each AND gate 11 connected to the word lines $WL_1 \ldots WL_{11} \ldots WL_{127}$ corresponding to the odd number row. As shown in FIG. 8, the adjacent row selecting circuit 9 is a logic circuit including a plurality of inverters 14, a plurality of AND gates 15, and a plurality of OR gates 16. The adjacent row selecting circuit 9 receives $A_9$–$A_7$ of the upper 3 bits of the row address R and outputs selection signals $B_0$–$B_7$ through 8 output lines in accordance with Truth Table shown in Table 1.

Table 1

| $A_9$ | $A_8$ | $A_7$ | $B_7$ | $B_6$ | $B_5$ | $B_4$ | $B_3$ | $B_2$ | $B_1$ | $B_0$ |
|---|---|---|---|---|---|---|---|---|---|---|
| 0 | 0 | 0 | 1 | 1 | 1 | 1 | 1 | 1 | 1 | 1 |
| 0 | 0 | 1 | 1 | 1 | 1 | 1 | 1 | 1 | 1 | 0 |
| 0 | 1 | 0 | 1 | 1 | 1 | 1 | 1 | 1 | 0 | 0 |
| 0 | 1 | 1 | 1 | 1 | 1 | 1 | 1 | 0 | 0 | 0 |
| 1 | 0 | 0 | 1 | 1 | 1 | 1 | 0 | 0 | 0 | 0 |
| 1 | 0 | 1 | 1 | 1 | 1 | 0 | 0 | 0 | 0 | 0 |
| 1 | 1 | 0 | 1 | 1 | 0 | 0 | 0 | 0 | 0 | 0 |
| 1 | 1 | 1 | 1 | 0 | 0 | 0 | 0 | 0 | 0 | 0 |

More specifically, assuming that decimal numbers shown by $A_9$–$A_7$ of the highest 3 bits to be input is i, the adjacent row selecting circuit 9 sets only the selection signals $B_1$–$B_7$ to be "1" (active). The selection signals $B_0$–$B_7$ respectively correspond to the sub-arrays 6-0 to 6-7. Since the selection signal $B_7$ is always fixed at "1" active), it is omitted from FIG. 8.

Thus, assuming that decimal numbers shown by $A_9$–$A_7$ of the upper 3 bits of the row address R is i, the row address control circuit 4 shown in FIGS. 5 and 6 activates only the word line WL on the forward side corresponding to the even number row with respect to each sub-array 6-i through 6-7 after the sub-array 6-i. The row address control circuit 4 activates only the word line WL on the backward side corresponding to the odd number row. For example, in the case of accessing data in the rectangular region S of 8×8 pixels with the upper left corner at a coordinate (91, 69) being an origin as shown in FIG. 2, a pixel address (an origin address of the region S) of data of a pixel at the origin is input. In this case, the pixel at the origin is in the 11th block, so that the decimal number of $A_6$–$A_0$ of the lower 7 bits of the row address R becomes 11. Since the pixel at the origin is on the 3rd row counted from the 0th row in the 11th block, the decimal number of $A_9$–$A_7$ of the highest 3 bits becomes 3. Then, regarding the sub-arrays 6-3 through 6-7, the word lines $WL_{11(3)}$, $WL_{11(4)}$, $WL_{11(5)}$, $WL_{11(6)}$, and $WL_{11(7)}$ become active (represented by "1" in FIG. 6), and the 11th memory row is respectively selected. Regarding the sub-arrays 6-0 through 6-2, the word lines $WL_{12(0)}$, $WL_{12(1)}$, and $WL_{12(2)}$ become active (represented by "1" in FIG. 5), and the 12th memory row is respectively selected.

Figure 9:
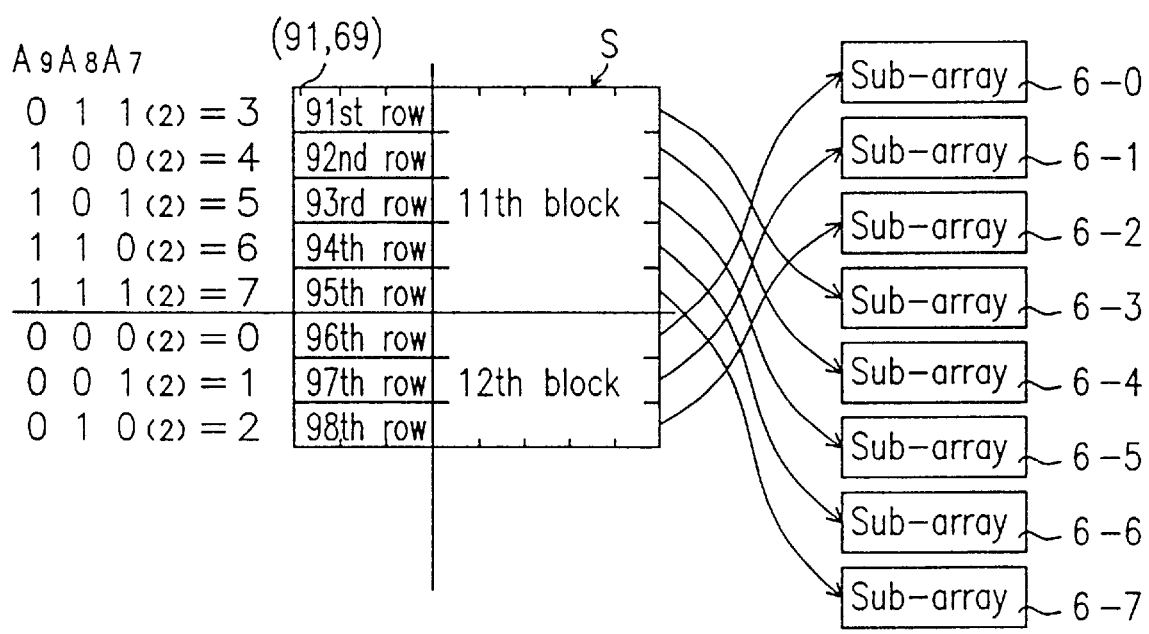
FIG. 9 shows the relationship between a rectangular region of 8×8 pixels and each sub-array in Example 1 according to the present invention.

More specifically, as shown in FIG. 9, the 0th row (the 91st pixel row) to the 4th row (the 95th pixel row) in the region S is in the 11th block, so that data is respectively stored in the 11th memory row in the sub-arrays 6-3 through 6-7 to which each pixel row corresponds. The 5th row (the 96th pixel row) to the 7th row (the 98th pixel row) in the region S is in the 12th block, so that data is respectively stored in the 12th memory row in the sub-arrays 6-0 through 6-2 to which each pixel row corresponds. In the case where the origin address is not in the 0th row in the block as described above, the rectangular region S of 8×8 pixels extends across two blocks. Therefore, the row address control circuit 4 adjusts the memory row selected on a sub-array 6-i basis.

When the origin address in the rectangular region S of 8×8 pixels is input, the row address control circuit 4 simultaneously selects each memory row corresponding to 8 rows after the origin address in 8 sub-arrays 6-0 through 6-7, and the column selector 6b simultaneously selects 8 memory columns after the origin address. Therefore, the whole data of 64 bits in the region S can be written or read at a time.

Figure 10:
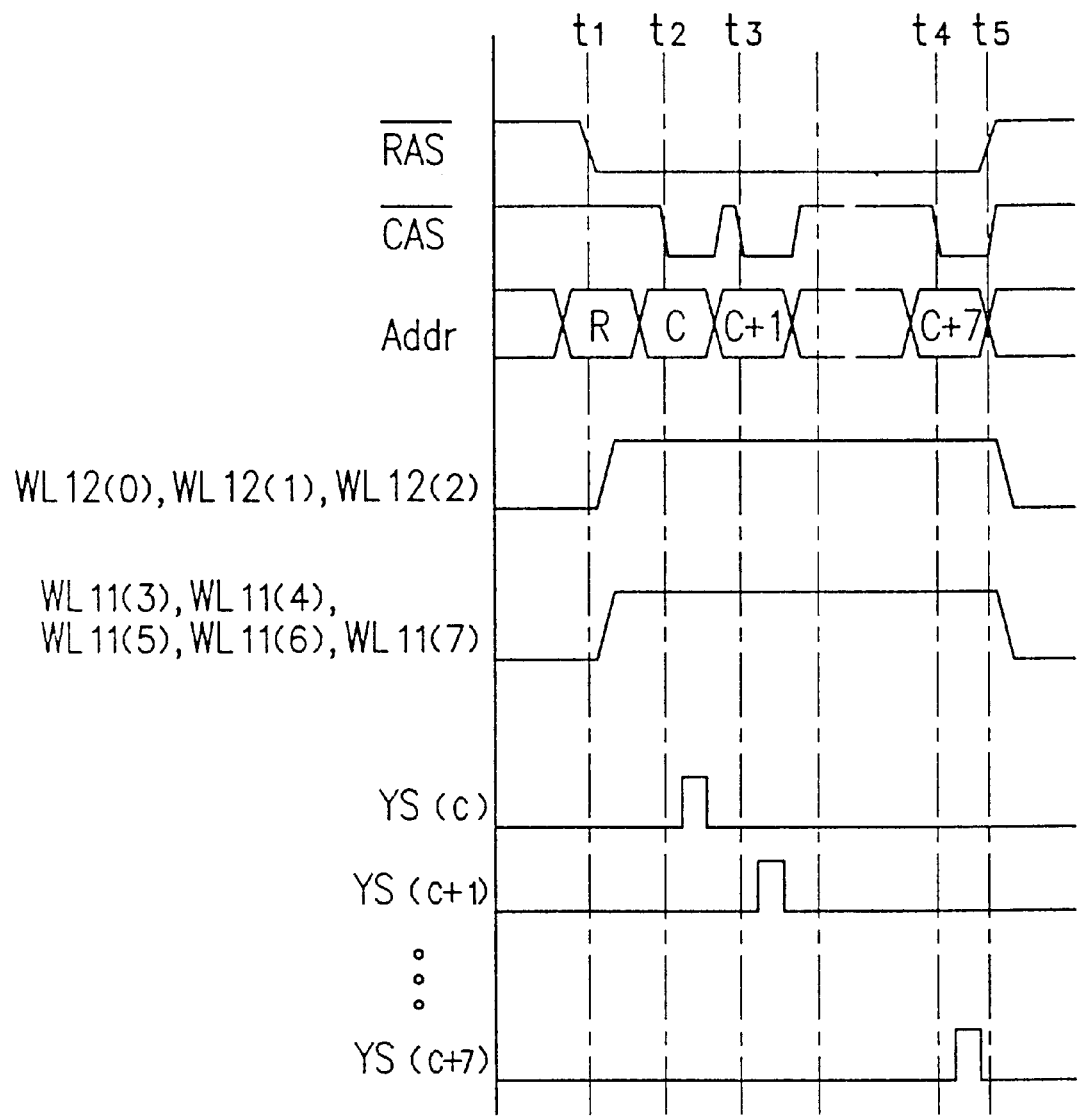
FIG. 10 is a timing diagram showing an operation in a page mode of the semiconductor memory device in Example 1 according to the present invention.

The operation of the semiconductor memory device with the above-mentioned structure will be described with reference to a timing diagram shown in FIG. 10. Herein, the operation in which one data line DIO is connected to each sub-array 6-i, and the column selector 6b transfers data by 1 bit to each memory column in a page mode will be described. Furthermore, the case where the row address R and the column address C of the origin address in the region S is transmitted in order to access the whole data in the rectangular region S of 8×8 pixels shown in FIG. 2 will be illustrated.

First, the row address R is input from outside to the semiconductor memory device as the address Addr, whereby a row address strobe signal RASbar falls at time $t_1$. The row address latch 1 latches the row address R, and the row address control circuit 4 allows the word lines $WL_{11(3)}$, $WL_{(4)}$, $WL_{11(5)}$, $WL_{11(6)}$, and $WL_{11(7)}$ of the sub-arrays 6-3 through 6-7 as well as the word lines $WL_{12(0)}$, $WL_{12(1)}$, and $WL_{12(2)}$ to rise. In each sub-array 6-i, data from all the memory cells in the selected memory row is read onto bit lines and amplified by the sense amplifier 6a to become accessible.

Next, the column address C is input to the semiconductor memory device as the address Addr, whereby a column address strobe signal CASbar falls at time $t_2$. At this time, the column address latch 2 latches the column address C, and the column decoder 5 allows only a decode output $YS_{(C)}$ to rise. In each sub-array 6-i, the column selector 6b allows data to be transferred between one memory column corresponding to the column address C in the selected memory row and one data line DIO. The column address strobe signal CASbar is once allowed to rise, and a column address C+1 is input to the semiconductor memory device as the address Addr. At this time, the column address strobe signal CASbar falls at time $t_3$. The column address latch 2 latches the column address C+1, and the column decoder 5 allows a decode output $YS_{(C+1)}$ to rise. In each sub-array 6-i, data is transferred between one memory column corresponding to the column address C+1 in the same memory row as the previous one and one data line DIO. Thereafter, the column address strobe signal CASbar is allowed to fall while the column address C is successively increased in the same way, whereby data is transferred in a plurality of memory columns in the same memory row as the previous one in each sub-array 6-i.

Finally, a column address C+7 is input to the semiconductor memory device as the address Addr, whereby the column address strobe signal CASbar falls at time $t_4$. At this time, the column address latch 2 latches the column address C+7, and the column decoder 5 allows only a decode output $YS_{(C+7)}$ to rise. In each sub-array 6-i, data is transferred between one memory column corresponding to the column address C+7 in the same memory row as the previous one and one data line DIO. The column address strobe signal CASbar and the row address strobe signal RASbar are allowed to rise at time $t_5$, whereby access is completed. Thus, every time the column address strobe signal CASbar is allowed to fall, data of 8 bits is simultaneously transferred by 1 bit in each sub-array 6-i, whereby the whole data of 64 bits in the rectangular region S of 8×8 pixels can be accessed. Furthermore, in this case, in 8 sub-arrays 6-i, data of 8 bits on the identical memory column can be simultaneously transferred. Therefore, 8 rows of data can be accessed at a high speed. Even when 8 rows of data is accessed by 8 columns, a high-speed access in a page mode can be accessed.

In the case where 8 data lines DIO are connected to each sub-array 6-i, and data of 8 bits is simultaneously transferred in each column selector 6b, all of the data of 64 bits of data in the region S can be accessed at a higher speed only by inputting the row address R and the column address C of the origin address.

The semiconductor memory device of the present example has a structure in which each sub-array 6-i is connected to external data buses or the like through the data lines DIO, the common data lines CIO, and the input/output control circuit 7, as shown in FIG. 1. However, the present invention is not limited to this structure.

Example 2

Figure 11:
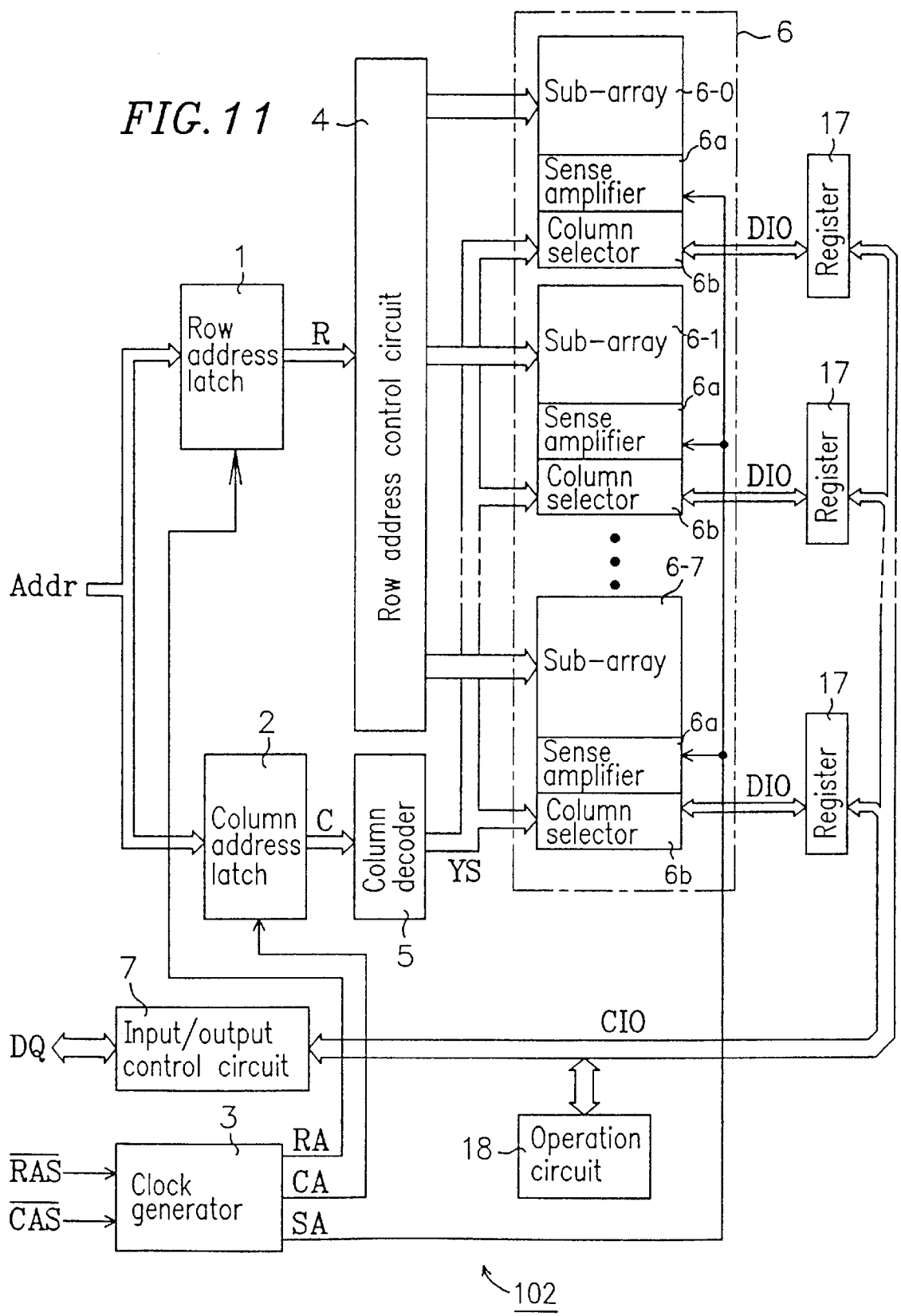
FIG. 11 is a block diagram showing an entire structure of a semiconductor memory device in Example 2 according to the present invention.

FIG. 11 illustrates a semiconductor memory device in Example 2 according to the present invention. As shown in this figure, a semiconductor memory device 102 has a structure in which data lines DIO of 8 bits are respectively connected to common data lines CIO of 64 bits through each register 17 of 8 bits, and an operation circuit 18 is connected through a bus to the common data lines CIO. The other structure is the same as that of Example 1.

In Example 2, the operation circuit 18 can be used for any image processing. For example, the operation circuit 18 can perform encoding and decoding processing according to the MPEG or the like at a high speed. Furthermore, the operation circuit 18 allows data to be transferred between the registers 17 and the outside in order to perform each operation outside.

In each of the above-mentioned examples, the case where the row address control circuit 4 selects a memory row in all the sub-arrays 6-i has been described. However, it is also possible to specify only a memory row of one sub-array 6-i specified by $A_9$–$A_7$ of the upper 3 bits of the row address R. In this case, when only $A_6$–$A_0$ of the lower 7 bits of the row address R are changed so as to access another data in the rectangular region of 8×8 pixels, a memory row in another sub-array 6-i is specified without fail. Therefore, the access to another data can be started immediately without waiting for the bit lines of the previous sub-array 6-i to be precharged. Thus, the rectangular region can be continuously accessed at a high speed.

In each of the above-mentioned examples, the row address control circuit 4 selects a memory row in all the sub-arrays 6-i. However, only the column selector 6b of one sub-array 6-i specified by $A_9$–$A_7$ of the upper 3 bits of the row address R may allow data to be transferred with respect to the data lines DIO. In this case, when only $A_6$–$A_0$ of the lower 7 bits of the row address R are changed and data is accessed again, a memory row in another sub-array 6-i is specified without fail, and data has already been read onto bit lines and amplified in this sub-array 6-i. Therefore, the data can be immediately accessed, and continuous access to the rectangular region can be made at a higher speed.

As described above, in the semiconductor memory device of the present invention, data in a rectangular region at any position including a plurality of rows and a plurality of columns can be accessed at a high speed in the row direction as well as in the column direction. Therefore, encoding and decoding processing according to the MPEG or the like and filling or the like in windows according to the multi-window system can be performed at a high speed. Furthermore, since the whole data in the rectangular region can be simultaneously or successively and continuously accessed with time division only by specifying one origin address, a processing operation becomes efficient. Furthermore, the whole data in the rectangular region is once transferred to a register, an internal operation circuit, an external processor, or the like can randomly obtain data. Therefore, the throughput of processing according to the MPEG or the like can be improved. In addition, if an internal operation circuit or like is constructed as one chip, a processing speed can be further improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a memory cell array including m sub-arrays which operate independently of each other, each having a number of memory cells arranged in a matrix and including M/m (m is an integer of 2 or more; M/m is an integer of 2 or more) memory rows and N (N is an integer of 2 or more) memory columns, in an image space in a matrix including M pixel rows and N pixel columns, the M pixel rows being divided into M/m blocks, m pixel rows in each of the M/m blocks being in a one-to-one correspondence with the m sub-arrays, the M/m blocks being in a one-to-one correspondence with the M/m memory rows in each of the sub-arrays; and
   a row address control circuit for, in a case where a pixel address of data on the image space is input, accessing the memory cell array by selecting a memory row corresponding to a block to which the data belongs in a sub-array corresponding to a pixel row of the block to which the data belongs.

2. A semiconductor memory device according to claim 1, wherein, in a case where the pixel address of data on the image space is input and the coordinates of one apex of four apexes is input as a start address, the four apexes included in a block to which the data belongs, the row address control circuit selects a memory row corresponding to the block to which the data belongs in a sub-array corresponding to a pixel row in the block to which the data belongs, and selects a memory row corresponding to the block to which the data belongs or a memory row corresponding to a block adjacent to the block to which the data belongs in the other sub-arrays.

3. A semiconductor memory device according to claim 1, wherein, in each of the sub-arrays, n pieces of data (n is an integer of 2 or more and less than N) are written in parallel in n memory columns of memory cells in the memory row selected by the row address control circuit, and n pieces of data are read in parallel from the n columns of the memory cells, whereby the memory cell array is accessed.

4. A semiconductor memory device according to claim 1, wherein each of the sub-arrays includes a sense amplifier which amplifies data read onto bit lines from any one memory cell of the memory column on a memory column basis and a column selector which selects n memory columns, n being an integer of one or more, from the entire memory columns, transfers the amplified data read onto the bit lines of the selected memory columns to data lines, and transfers the data on the data lines to bit lines of the selected memory columns.

5. A semiconductor memory device according to claim 1, wherein n is an integer of one or more and M, m, N, and n are assumed to be 2M, 2m, 2N, and 2n, respectively, the image space specifies a pixel row by a row address of M bits in the image address and specifies a pixel column by a column address of N bits in the image address, and in a case where the image address of the data on the image space is input, the row address control circuit selects a memory row specified by an address of M-m bits in the row address or a memory row adjacent to the memory row in each of the sub-array, and selects 2n memory columns including memory columns specified by the column address of N bits, thereby accessing the memory cell array.

6. A semiconductor memory device according to claim 1, wherein, in a case where the image address of the data on the image space is input, the row address control circuit selects a memory row corresponding to a block to which the data belongs in a sub-array corresponding to a pixel row of the block to which the data belongs and each pixel row after the pixel row selects a memory row corresponding to a block adjacent to the block to which the data belongs in the other sub-arrays, and selects a plurality of memory columns corresponding to a plurality of pixel columns after a pixel column to which the data belongs, thereby accessing the memory cell array.

7. A semiconductor memory device according to claim 1, wherein the image space is used for specifying a pixel row by the row address in the pixel address, and the row address control circuit includes a row sub-decoder which fully decodes an address of p bits, p being an integer of one or more, in the row address to activate any one of $2^P$ outputs, a logic circuit which performs OR-operation with respect to adjacent outputs from the row sub-decoder to activate two outputs, and an adjacent row selecting circuit which selects any of two outputs activated by the logic circuit on a sub-array basis to select a memory row in each of the sub-arrays.

8. A semiconductor memory device according to claim 1, wherein each of the sub-arrays includes a sense amplifier which amplifies data read onto bit lines from any one memory cell of the memory column on a memory column basis and a common data line which selects n memory columns, n being an integer of one or more, from the entire memory columns, transfers the amplified data read onto the bit lines of the selected memory columns to data lines, and selects and transfers the data on the data lines corresponding to each of the sub-arrays, and an image processing system is controlled by a processor connected to the common data lines through a bus.

9. A semiconductor memory device according to claim 1, wherein each of the sub-arrays includes a sense amplifier which amplifies data read onto bit lines from any one memory cell of the memory column on a memory column basis and a common data line which selects n memory columns, n being an integer of one or more, from the entire memory columns, transfers the amplified data read onto the bit lines of the selected memory columns to data lines, and is connected in parallel to the data lines corresponding to each of the sub-arrays, and an image processing system is controlled by a processor connected to the common data line through a bus.

* * * * *